United States Patent [19]

Voelkel et al.

[11] Patent Number: 5,428,306
[45] Date of Patent: Jun. 27, 1995

[54] COMPACT MULTIPLEXER CIRCUIT

[75] Inventors: Eric Voelkel, Santa Clara; Ajit Medhekar, San Jose, both of Calif.

[73] Assignee: Alliance Semiconductor Corporation, Del.

[21] Appl. No.: 249,440

[22] Filed: May 26, 1994

[51] Int. Cl.6 .............................................. H03K 19/20
[52] U.S. Cl. .................................... 326/121; 327/407; 327/408; 326/112
[58] Field of Search ................... 327/97, 99, 408, 407; 326/112, 121

[56] References Cited

U.S. PATENT DOCUMENTS 4,468,574 8/1984 Engeler et al. ...................... 326/121
4,507,574 3/1985 Seki et al. ............................ 326/121

Primary Examiner—Timothy P. Callahan
Assistant Examiner—Jung Ho Kim
Attorney, Agent, or Firm—Limbach & Limbach

[57] ABSTRACT

A design approach for a tree structure multiplexer produces a compact circuit layout by reducing the required number of transistors. The multiplexer is used to perform a binary decode of the input signals to generate a single selection of one of a number of potential outputs. since the inputs undergo a binary decode, the number of outputs is equal to $2^x$, where x is the number of inputs.

4 Claims, 7 Drawing Sheets

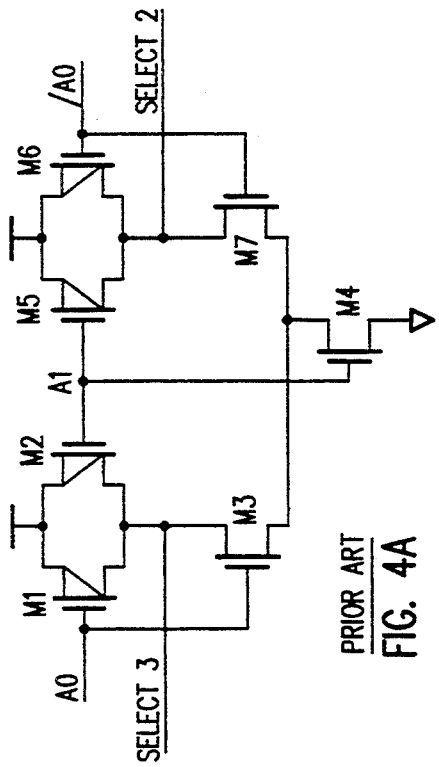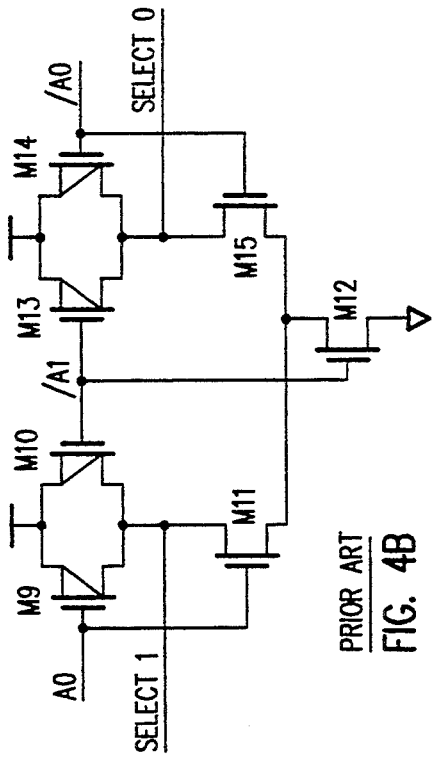
PRIOR ART
FIG. 4A
PRIOR ART
FIG. 4B
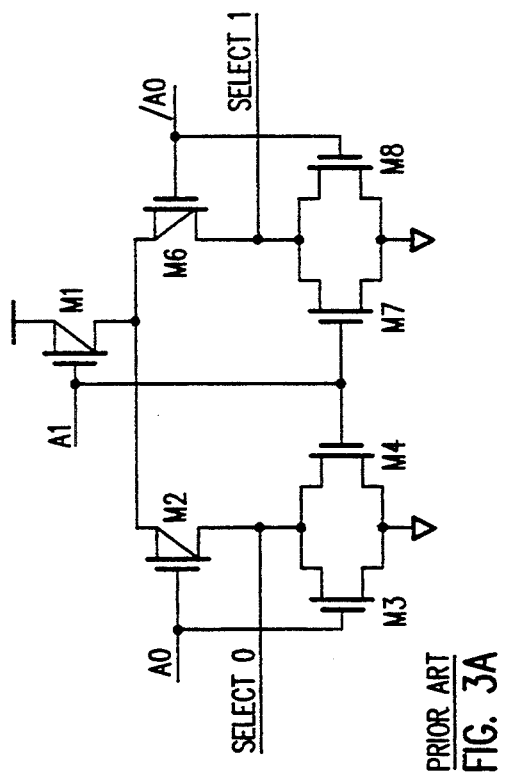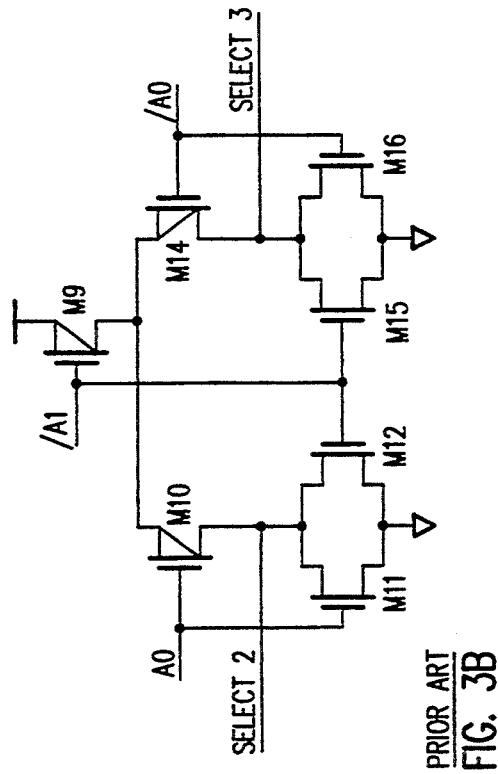
PRIOR ART
FIG. 3A
PRIOR ART
FIG. 3B

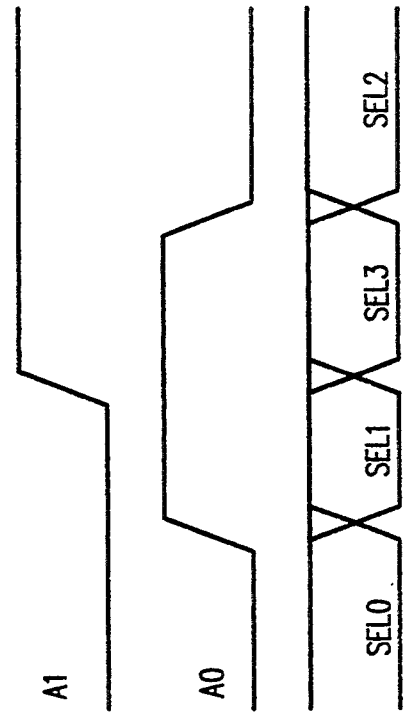
FIG. 8A
FIG. 8B
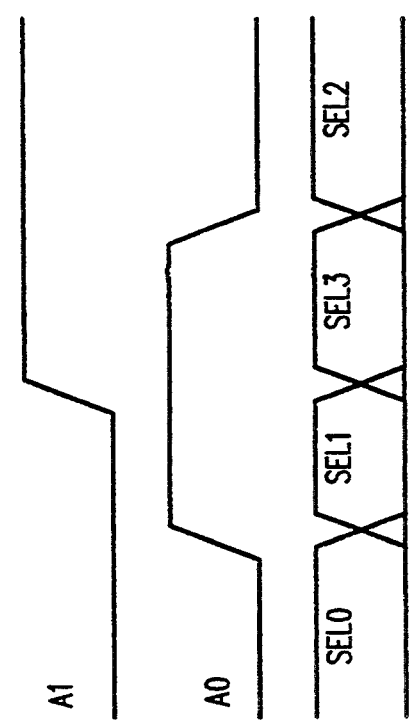
FIG. 7A
FIG. 7B

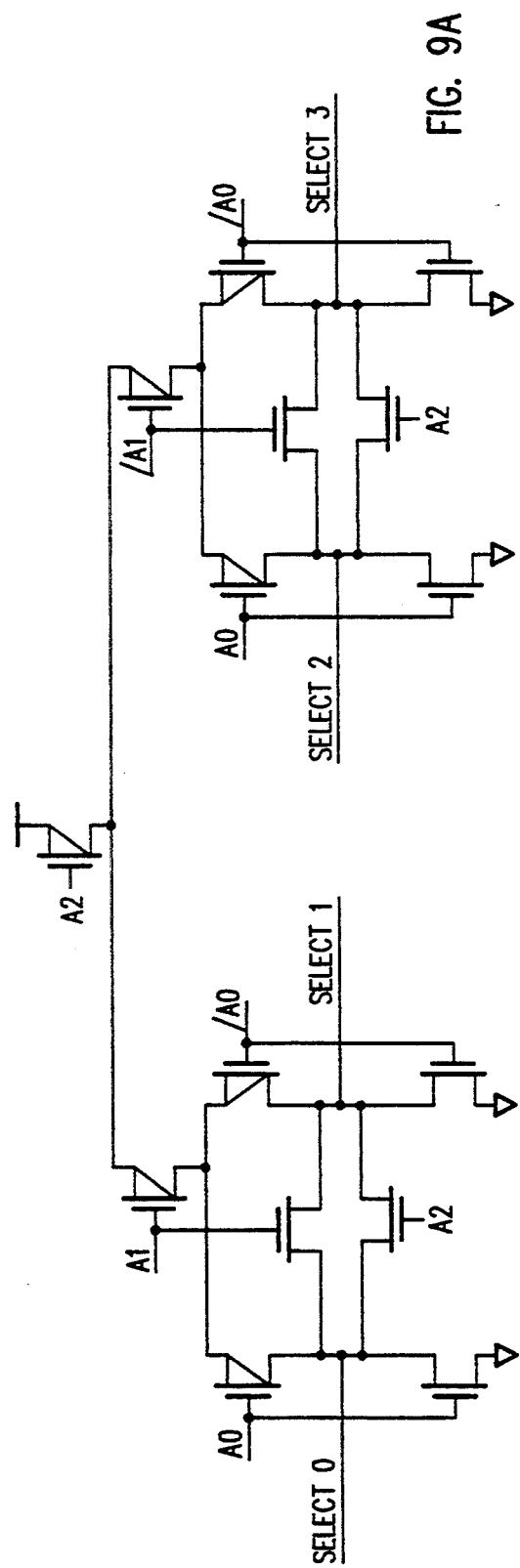
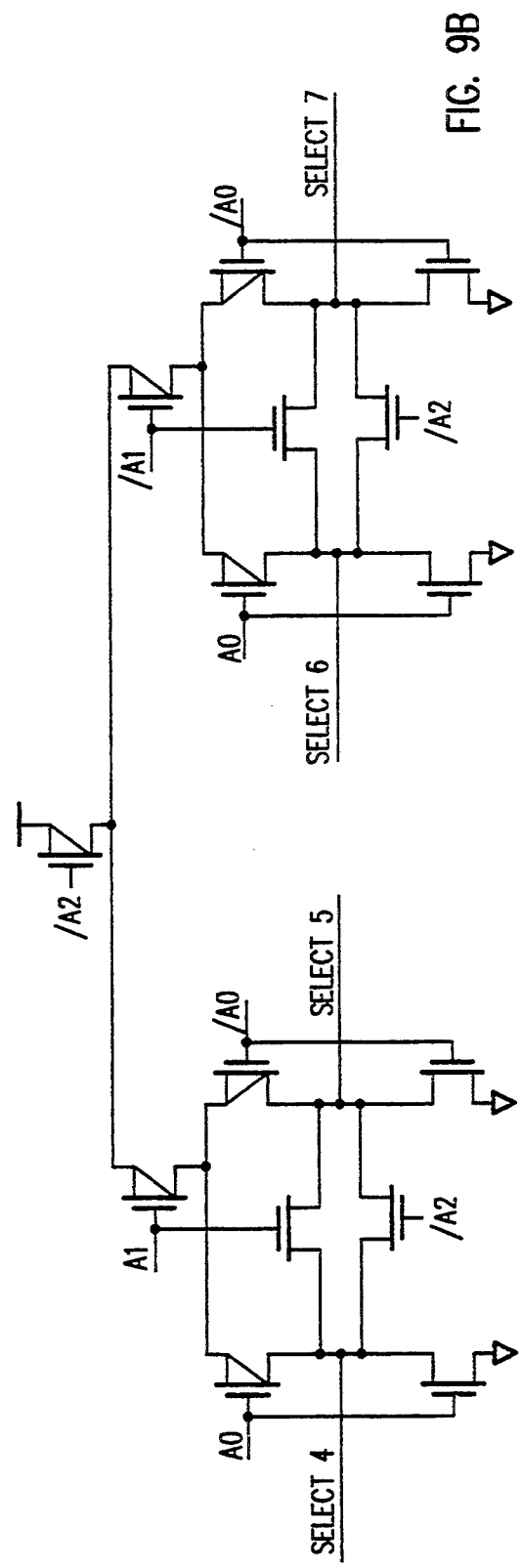
FIG. 9A
FIG. 9B

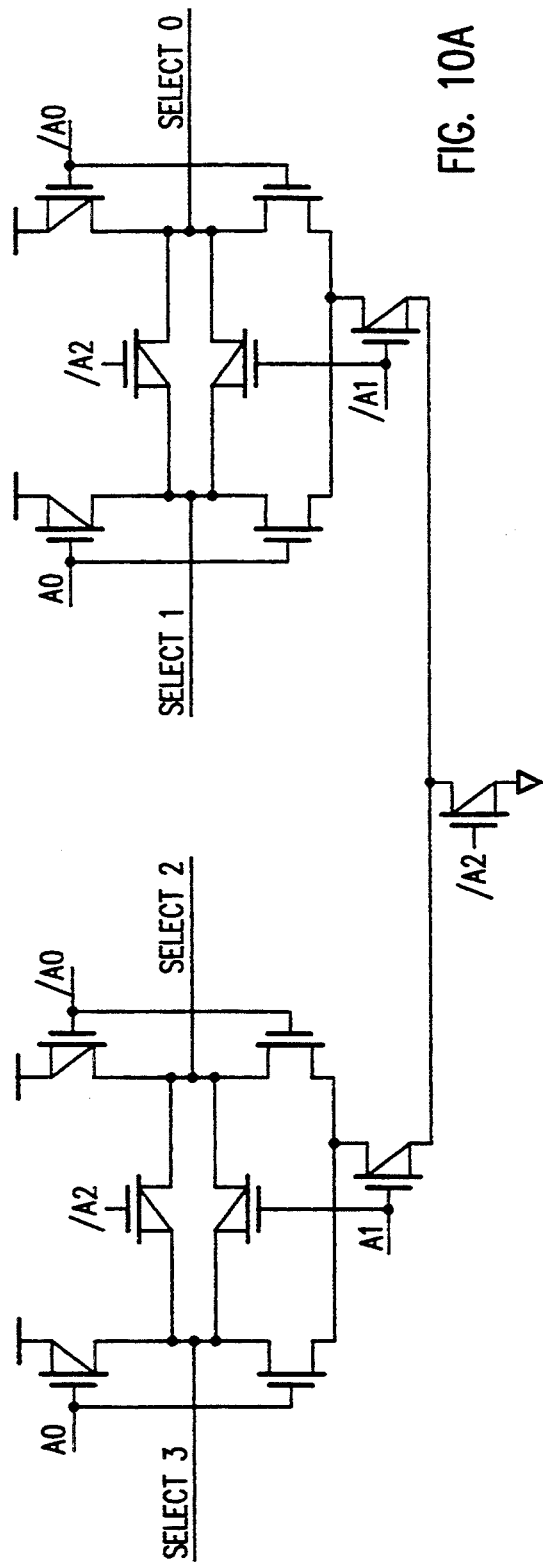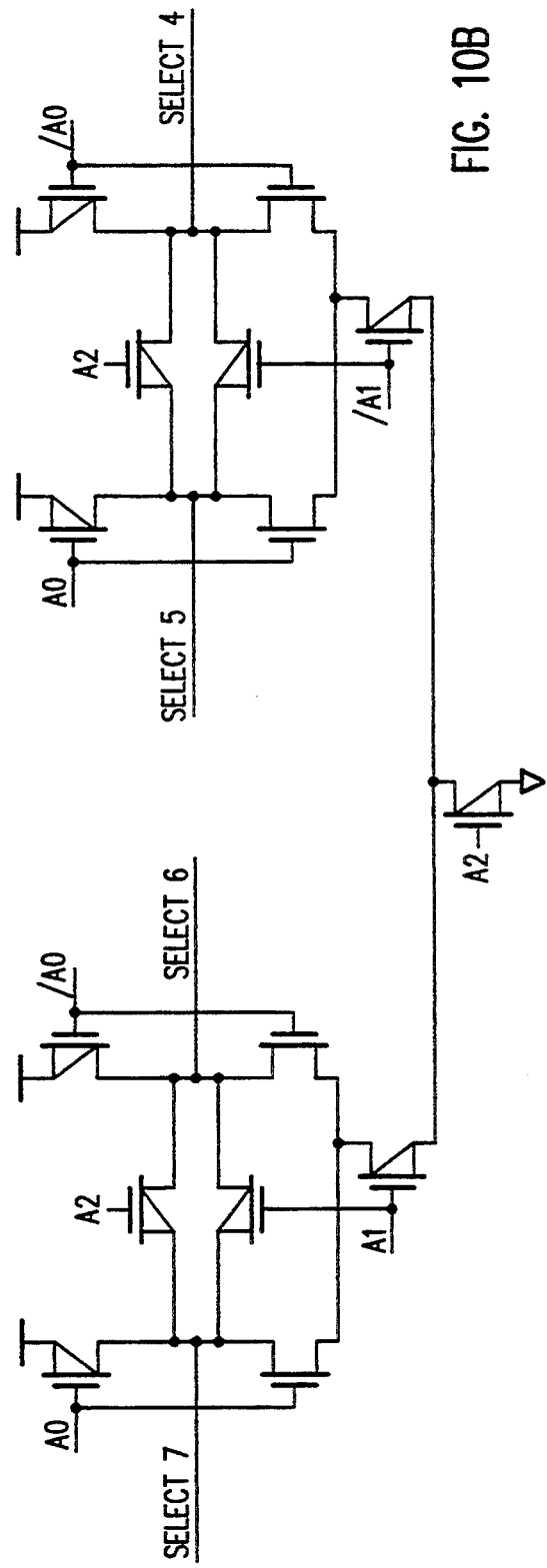
FIG. 10A
FIG. 10B

COMPACT MULTIPLEXER CIRCUIT

BACKGROUND OF THE INVENTION

1. Field of the Invention

The present invention relates to multiplexers and, in particular, to a compact multiplexer design that reduces the number of transistors required for a tree structure multiplexer.

2. Discussion of Prior Art

A multiplexer performs a binary decode of input signals to select a single output from a number of potential outputs. For purposes of discussion in this document, multiplexer input signals will be referred to as "addresses" and multiplexer output signals will be referred to as "selects".

For purposes of simplicity, two prior art multiplexers having only two addresses will be described. Those skilled in the art will appreciate that multiplexers having more than two addresses are common. Both of the described multiplexers can be designed for either a select logic low or a select logic high.

A first conventional multiplexer design, and the most simple, uses NOR-gates or NAND-gates. FIGS. 1A–1D show a NOR-gate design that generates four selects from two addresses. In this case, a select is enabled when it is high. FIGS. 1A–1D combine to show both the logic-level and transistor-level schematics for each of the four respective selects.

FIGS. 2A–2D combine to show the corresponding NAND-gate design. In this case, a select is enabled when it is low.

A second multiplexer design is commonly referred to as a tree structure. In this design, logically identical transistors are combined. For example, transistor M1 in FIG. 1A is combined with transistor M5 in FIG. 1B and transistor M9 in FIG. 1C is combined with transistor M13 in FIG. 1D to arrive at the tree structures shown in FIGS. 3 and 3B, respectively. Similarly, transistor M4 in FIG. 2A is combined with transistor M8 in FIG. 2B and transistor M12 in FIG. 2C is combined with transistor M16 in FIG. 2D to arrive at the tree structures shown in FIGS. 4A and B, respectively.

SUMMARY OF THE INVENTION

The present invention provides a design approach for the compact layout of mutliplexer circuits. The multiplexer is used to perform a binary decode of the input signal to generate a single selection of one of a number potential outputs. Since the inputs undergo a binary decode, the number of outputs is equal to $2^x$ where x is the number of inputs. The design approach of the present invention allows a reduction in the number of transistors necessary for implementation of a tree structure multiplexer.

A better understanding of the features and advantages of the present invention will be obtained by reference to the following detailed description and accompanying drawings which set forth an illustrative embodiment in which the principals of the invention are utilized.

DESCRIPTION OF THE DRAWINGS

FIGS. 3A and 3B are transistor-level schematic diagrams illustrating the respective combination of the FIGS. 1A–1B and FIGS. 1C–1D NOR-gates into corresponding tree multiplexer structures.

FIGS. 4A and 4B are transistor-level schematic diagrams illustrating the respective combination of the FIGS. 2A–2B and FIGS. 2C–2D NAND-gates into corresponding tree multiplexer structures.

FIGS. 7 provides a truth table and a typical waveform, respectively, illustrating the characteristics of the multiplexer shown in FIG. 5.

FIGS. 8 provides a truth table and a typical waveform, respectively, illustrating the characteristics of the multiplexer shown in FIG. 6.

FIG. 9 is a transistor-level schematic diagram illustrating the FIG. 5 2-address multiplexer design extended to a corresponding 3-address multiplexer design in accordance with the present invention.

FIG. 10 is a transistor-level schematic diagram illustrating the extension of the FIG. 6 2-address multiplexer design to a corresponding 3-address multiplexer design in accordance with the present invention.

DETAILED DESCRIPTION OF THE INVENTION

The present invention allows reduction of the number of transistors necessary in a tree multiplexer structure.

Figure 5A:
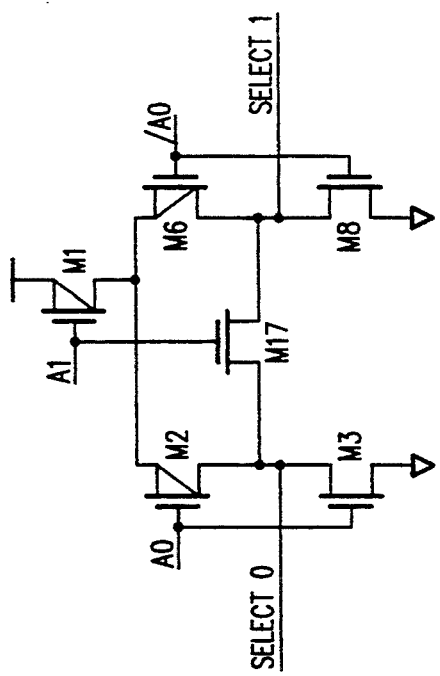
FIG. 5 is a transistor-level schematic diagram illustrating transistor count reduction in the FIGS. 3A and 3B tree structures to arrive at a multiplexer design in accordance with the present invention.
Figure 5B:
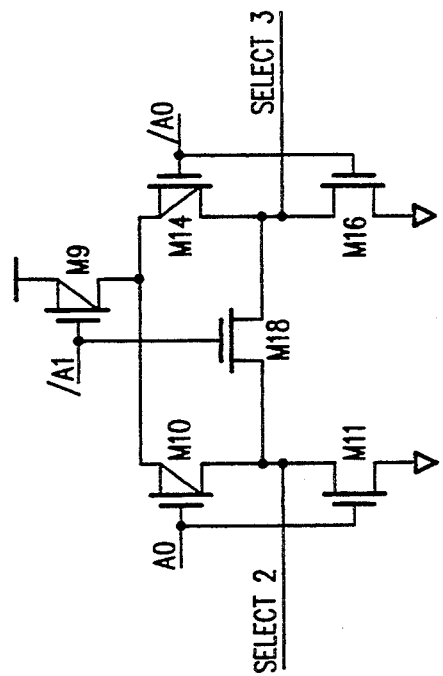

Referring to FIG. 5, in accordance with the present invention, the transistor count of the FIG. 3A multiplexer structure is reduced by replacing transistors M4 and M7 with transistor M17. Similarly, as shown in FIG. 5, transistors M12 and M15 in FIG. 3A are replaced by transistor M18.

Figure 1A:
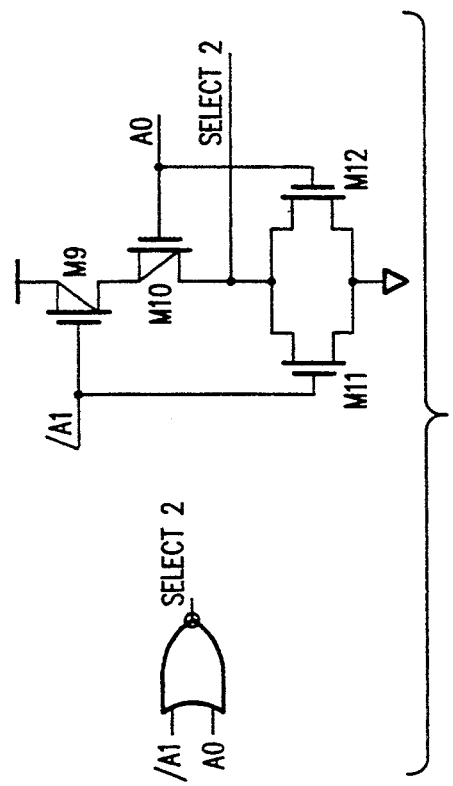
FIGS. 1A–1D are schematic diagrams that combine to illustrate a NOR-gate multiplexer in which SELECT1–SELECT4 are respectively enabled high.
Figure 1C:
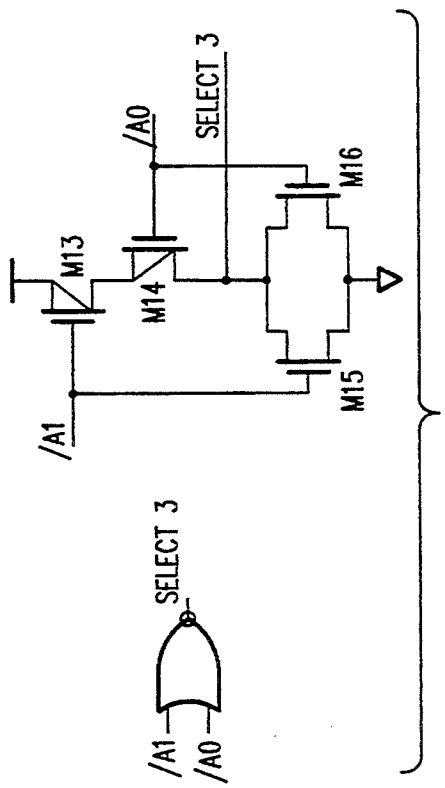
Figure 1B:
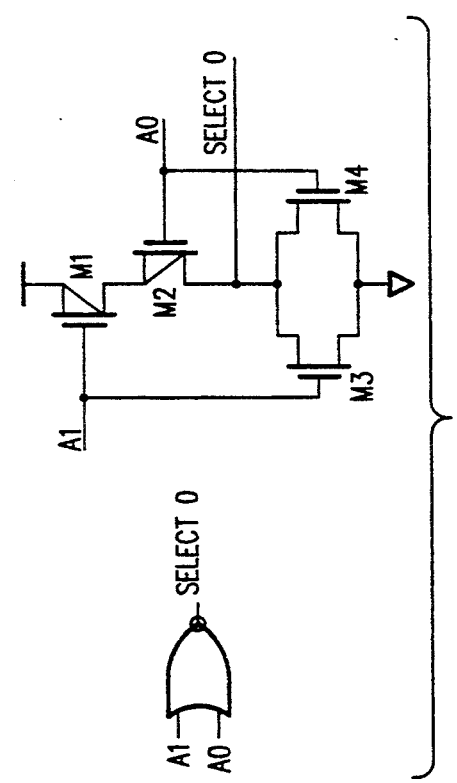
Figure 1D:
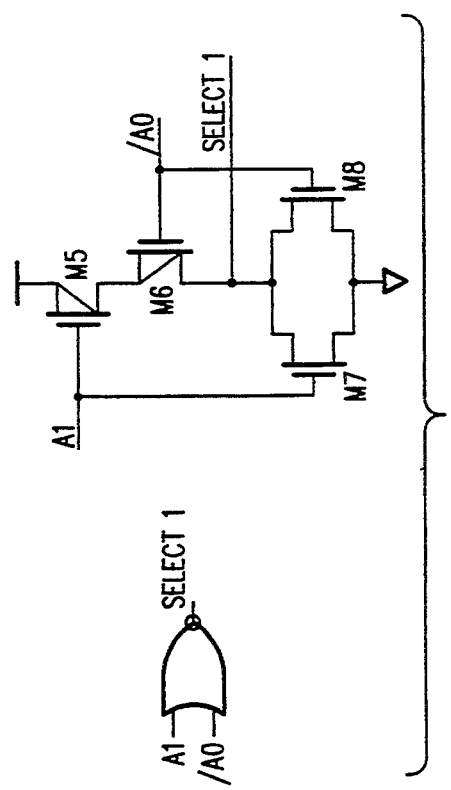
Figure 2A:
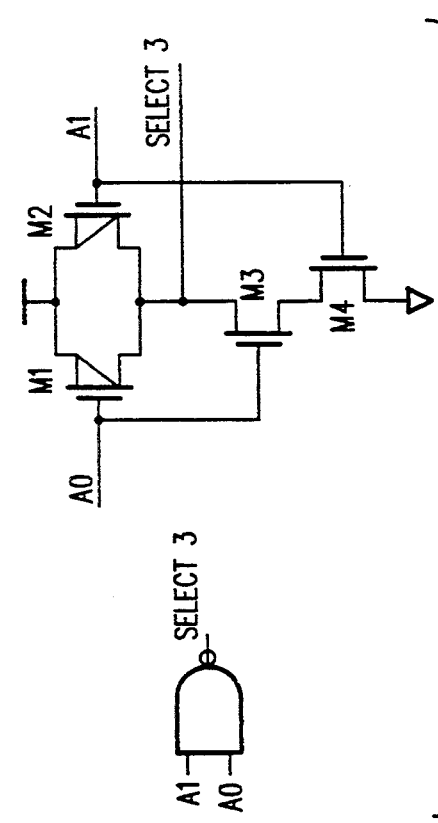
FIGS. 2A–2D are schematic diagrams that combine to illustrate a NAND-gate multiplexer in which SELECT1–SELECT4 are respectively enabled low.
Figure 2B:
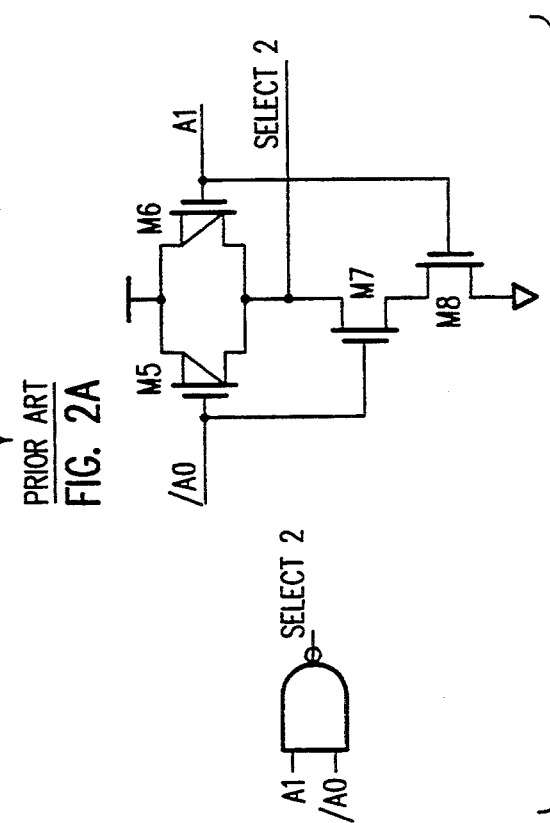
Figure 2C:
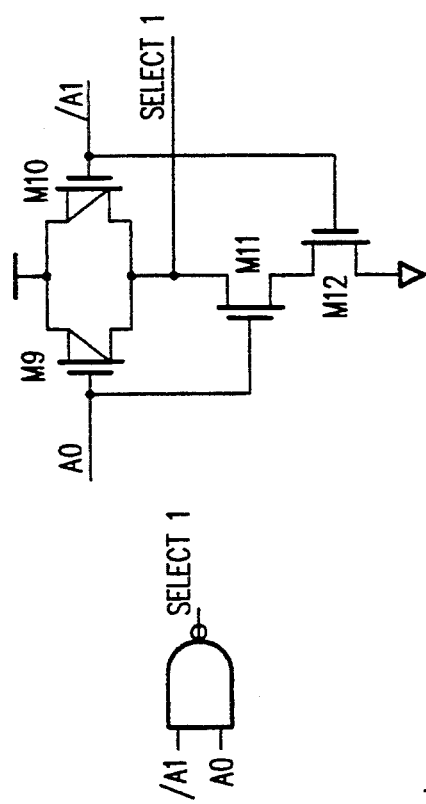
Figure 2D:
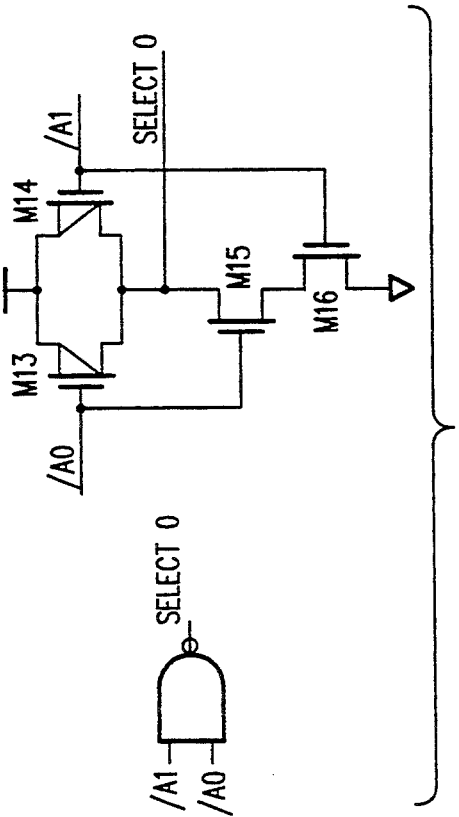
Figure 6A:
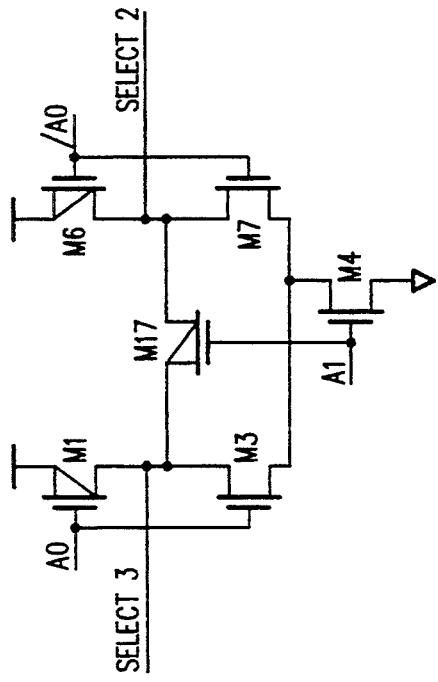
FIG. 6 is a transistor-level schematic diagram illustrating transistor count reduction in the FIGS. 4A and 4B tree structure to arrive at a multiplexer design in accordance with the present invention.
Figure 6B:
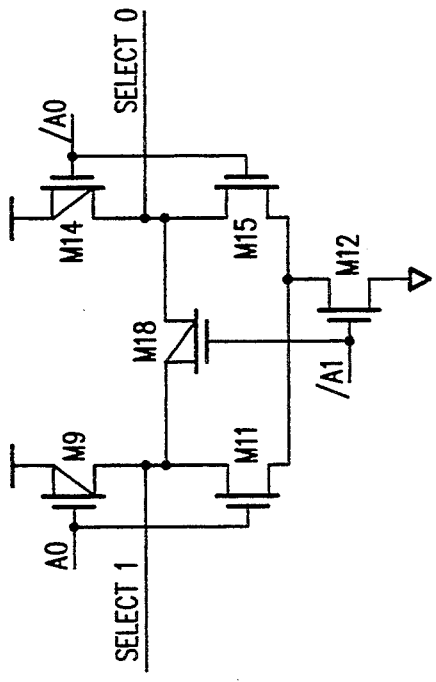

Referring to FIG. 6, the transistor count in the FIG. 4 multiplexer structure is reduced by replacing transistors M2 and M5 with transistor M17; also in FIG. 6, transistors M10 and M13 in FIG. 4 are replaced by transistor M18.

Although the resulting circuits are not logically identical, they are functionally equivalent, as will be described in greater detail below. In addition, since the SELECTS in the FIG. 5 circuit are enabled with a high signal, and the SELECTS in the FIG. 6 circuit are enabled with a low signal, these circuits are no slower in enabling a select than are the prior art circuits shown in FIGS. 1–4.

FIG. 5 shows a 2-input multiplexer with a select enabled when it is high. Consider the case when addresses A0 and A1 are both low. Since A0 and A1 are logically opposite signals, they are both high. In this state, SELECT 0 is high and the SELECTS 1–3 are all low.

An aspect of this invention lies in the way selects are enabled and disabled when an address switches. Consider the case when address A1 switches from a low to a high and, thus, A1 switches from a high to a low. A1 switches from to high to low, turning off transistor M18. This isolates SELECT 2 from SELECT 3. Simultaneously, transistor M9 is turned on. Since address A0 is low, transistor M10 is also on, and SELECT 2 goes high. Since transistors M9 and M10 are the same size and configuration in the FIG. 5 circuit as in the FIG. 1 and FIG. 3 circuits, select speed is the same.

When address A1 switches from low to high, transistor M17 is turned on. Simultaneously, transistor M1 is turned off. Since A0 is high, SELECT 0 is discharged from high to low through transistors M17 and M8.

A further aspect of this invention is that, since address A0 and its complement A0 are guaranteed opposite signals, there will always be a discharge path to disable the SELECT signal. Although this deselect time is slower by virtue of having to discharge through two transistors instead of one as in the FIGS. 1 and 3 circuits, deselect time is typically not critical for multiplexer applications.

FIG. 7 provides a truth table and typical waveform characteristics, respectively, for the multiplexer circuit shown in FIG. 5.

FIG. 6 shows a 2-input multiplexer with a select enabled when it is low. Consider the case when addresses A0 and A1 are both low. Since A0 and A1 are logically opposite to A0 and A1, respectively, they are both high. In this state, SELECT 0 is low, and the SELECTS 1–3 are all high.

Consider what happens when address A1 switches from a low to a high and, thus, its complement A1 switches from a high to a low. Address A1 switches form low to high, turning off transistor M17. This isolates SELECT 2 from SELECT 3. Simultaneously, transistor M4 is turned on. Since A0 is high, transistor M7 is also on, and Select 2 goes low. Since transistor M7 and transistor M4 are the same size and configuration in FIG. 6 as in the FIG. 2 and FIG. 4 embodiments, select speed is the same.

When A1 switches from high to low, transistor M18 is turned on. Simultaneously, transistor M12 is turned off. Since address A0 is low, SELECT 0 is charged from low to high through transistors M9 and M18.

Again, since address A0 and A0 are guaranteed opposite signals, there will always be a charge path to disable the SELECT signal. Although this deselect time is slower by virtue of having the charge flow through two transistors instead of the one transistor as shown in FIGS. 2 and 4, deselect time is typically not critical for multiplexer applications.

FIG. 8 provides a truth table and typical waveforms, respectively, for the multiplexer circuit shown in FIG. 6.

FIGS. 9 and 10 show examples of how the 2-input multiplexer circuits shown in FIGS. 5 and 6, respectively, can be extended to multiplexers with more inputs. The examples provided are for 3-address multiplexers, but demonstrate the generic process by which the concepts of this invention can be utilized to extend to multiplexers to any number of addresses.

It should be understood that various alternatives to the embodiment of the invention described herein may be employed in practicing invention. It is intended that the following claims define the scope of the invention and that structures and methods within the scope of these claims and their equivalents be covered thereby.

What is claimed is:

1. A 2-input multiplexer circuit comprising:
   a first p-channel transistor (M1) having its source connected to a positive supply voltage and its gate connected to receive a first input address signal (A1);
   a second p-channel transistor (M2) having its source connected to a drain of the first p-channel transistor and its drain connected to a first output node that provides a first output select signal (SELECT0);
   a first n-channel transistor (M3) having its drain connected to the first output node and its source connected to a negative supply voltage p1 a gate of the second p-channel transistor and a gate of the first n-channel transistor being commonly connected to receive a second input address signal (A0);
   a third p-channel transistor (M6) having its source connected to the drain of the first p-channel transistor and its drain connected to a second output node that provides a second output select signal (SELECT1);
   a second n-channel transistor (M8) having its drain connected to the second output node and its source connected to the negative power supply voltage;
   a gate of the third p-channel transistor and a gate of the second n-channel transistor being commonly connected to receive a complement (IA0) of the second input address signal;
   a third n-channel transistor (M17) connected between the first and second output nodes and having its gate connected to receive the first input address signal;
   a fourth p-channel transistor (M9) having its source connected to the positive supply voltage and its gate connected to receive a complement (IA1) of the first input address signal;
   a fifth p-channel transistor (M10) having its source connected to a drain of the fourth p-channel transistor and its drain connected to a third output node that provides a third output select signal (SELECT2);
   a fourth n-channel transistor (M11) having its drain connected to the third output node and its source connected to the negative supply voltage;
   a gate of the fifth p-channel transistor and a gate of the fourth n-channel transistor being commonly connected to receive the second input address signal (A0);
   a sixth p-channel transistor (M14) having its source connected to the drain of the fourth p-channel transistor and its drain connected to a fourth output node that provides a second output select signal (SELECT3);
   a fifth n-channel transistor (M16) having its drain connected to the fourth output node and its source connected to the negative power supply voltage;
   a gate of the sixth p-channel transistor and a gate of the fifth n-channel transistor being commonly connected to receive the complement (1A0) of the second input address signal; and
   a sixth n-channel transistor (M18) connected between the third and fourth output nodes and having its gate connected to receive the complement of the first input address signal.

2. A 2-input multiplexer circuit comprising:
   a first n-channel transistor (M12) having its source connected to a negative supply voltage and its gate connected to receive a complement of a first input address signal (A1);

a second n-channel transistor (M15) having its source connected to a drain of the first n-channel transistor and its drain connected to a first output note that provides a first output select signal (SELECT0);

a first p-channel transistor (M14) having its drain connected to the first output node and its source connected to a positive supply voltage a gate of the second n-channel transistor and a gate of the first p-channel transistor being commonly connected to receive a complement (1A0) of a second input address signal (A0);

a third n-channel transistor (M11) having its source connected to the drain of the first n-channel transistor and its drain connected to a second output node that provides a second output select signal (SELECT1);

a second p-channel transistor (M9) having its drain connected to the second output node and its source connected to the positive supply voltage;

a gate of the third n-channel transistor and the gate of the second p-channel transistor being commonly connected to receive the second input address signal;

a third p-channel transistor (M18) connected between the first and second output nodes and having its gate connected to receive the complement of the first input address signal;

a fourth n-channel transistor (M4) having its source connected to the negative supply voltage and its gate connected to receive the first input address signal;

a fifth n-channel transistor (M7) having its source connected to a drain of the fourth n-channel transistor and its drain connected to a third output note that provides a third output select signal (SELECT2);

a fourth p-channel transistor (M6) having its drain connected to the third output node and its source connected to the positive supply voltage a gate of the fifth n-channel transistor and a gate of the fourth p-channel transistor and being commonly connected to receive the complement of the second input address signal;

a sixth n-channel transistor (M3) having its source connected to the drain of the fourth n-channel transistor and its drain connected to a fourth output node that provides a fourth output select signal (SELECT3);

a fifth p-channel transistor (M1) having its drain connected to the fourth output node and its source connected to the positive supply voltage;

a gate of the sixth n-channel transistor and a gate of the fifth p-channel transistor being commonly connected to receive the second input address signal: and a sixth p-channel transistor (M17) connected between the third and fourth output nodes and having its gate connected to receive the first input address signal.

3. A 3-input multiplexer circuit comprising:

a first p-channel transistor having its source connected to a positive supply voltage and its gate connected to receive a first input address signal (A2);

a second p-channel transistor having its source connected to a drain of the first p-channel transistor and its gate connected to receive a second input address signal (A1);

a third p-channel transistor having its source connected to the drain of the first p-channel transistor and its gate connected to receive a complement of the second input address signal (A1);

a fourth p-channel transistor having its source connected to a drain of the second p-channel transistor and its drain connected to a first output node that provides a first output select signal (SELECT0);

a first n-channel transistor having its drain connected to the first output node and its source connected to a negative supply voltage;

a gate of the fourth p-channel transistor and a gate of the first n-channel transistor being connected to receive a third input address signal (A0);

a fifth p-channel transistor having its source connected to the drain of the second p-channel transistor and its drain connected to a second output node that provides a second output select signal (SELECT1);

a second n-channel transistor having its drain connected to the second output node and its source connected to the negative supply voltage;

a gate of the fifth p-channel transistor and a gate of the second n-channel transistor being connected to receive a complement of the third input address signal (A0);

a third n-channel transistor connected between the first and second output nodes and having its gate connected to receive the second input address signal (A1);

a fourth n-channel transistor connected between the first and second output nodes and having its gate connected to receive the first input address signal (A2);

a sixth p-channel transistor having its source connected to a drain of the third p-channel transistor and its drain connected to a third output node that provides a third output select signal (SELECT2);

a fifth n-channel transistor having its drain connected to the third output node and it source connected to the negative supply voltage;

a gate of the sixth p-channel transistor and a gate of the fifth n-channel transistor being connected to receive the third input address signal (A0);

a seventh p-channel transistor having its source connected to the drain of the third p-channel transistor and its drain connected to a fourth output node that provides a fourth output select signal (SELECT3);

a sixth n-channel transistor having its drain connected to the fourth output node and its source connected to the negative supply voltage;

the gate of the seventh p-channel transistor and the gate of the sixth n-channel transistor being connected to receive the complement of the third input address signal (A0);

a seventh n-channel transistor connected between the third and fourth output nodes and having its gate connected to receive the complement of the second input address signal;

an eighth n-channel transistor connected between the third and fourth output nodes and having its gate connected to receive the first input address signal (A2);

an eighth p-channel transistor having its source connected to the positive supply voltage and its gate connected to receive a complement of the first input address signal (A2);

a ninth p-channel transistor having its source connected to a drain of the eighth p-channel transistor and its gate connected to receive the second input address signal (A1);

a tenth p-channel transistor having its source connected to the drain of the eighth p-channel transistor and its gate connected to receive the complement of the second input address signal (A1);

an eleventh p-channel transistor having its source connected to the drain of the ninth p-channel transistor and its drain connected to a fifth output node that provides a fifth output select signal (SELECT4);

a ninth n-channel transistor having its drain connected to the fifth output node and its source connected to the negative supply voltage;

a gate of the eleventh p-channel transistor and a gate of the ninth n-channel transistor being connected to receive the third input address signal (A0);

a twelfth p-channel transistor having its source connected to the drain of the ninth p-channel transistor and its drain connected to a sixth output node that provides a sixth output select signal (SELECT5);

a tenth n-channel transistor having its drain connected to the sixth output node and its source connected to the negative supply voltage;

a gate of the twelfth p-channel transistor and a gate of the tenth n-channel transistor being connected to receive a complement of the third input address signal (A0);

an eleventh n-channel transistor connected between the fifth and sixth output nodes and having its gate connected to receive the second input address signal (A1);

a twelfth n-channel transistor connected between the fifth and sixth output nodes and having its gate connected to receive the complement of the first input address signal (A2); a thirteenth p-channel transistor having its source connected to the drain of the tenth p-channel transistor and its drain connected to a seventh output node that provides a seventh output select signal (SELECT6);

a thirteenth n-channel transistor having its drain connected to the seventh output node and it source connected to the negative supply voltage;

a gate of the thirteenth n-channel transistor and a gate of the thirteenth p-channel transistor being connected to receive the third input address signal (A0);

a fourteenth p-channel transistor having its source connected to the drain of the tenth p-channel transistor and its drain connected to an eighth output node that provides a eighth output select signal (SELECT7);

a fourteenth n-channel transistor having its drain connected to the eighth output node and its source connected to the negative supply voltage;

the gate of the fourteenth p-channel transistor and the gate of the fourteenth n-channel transistor being connected to receive the complement of the third input address signal (A0);

a fifteenth n-channel transistor connected between the seventh and eighth output nodes and having its gate connected to receive the complement of the second input address signal; and a sixteenth n-channel transistor connected between the seventh and eighth output nodes and having its gate connected to receive the complement of the first input address signal (A2).

4. A 3-input multiplexer circuit comprising:

a first n-channel transistor having its source connected to a negative power and its gate connected to receive a complement of a first input address signal (A2);

a second n-channel transistor having its source connected to a drain of the first n-channel transistor and its gate connected to receive a complement of a second input address signal (A1);

a third n-channel transistor having its source connected to the drain of the fast n-channel transistor and its gate connected to receive the second input address signal (A1);

a fourth n-channel transistor having its source connected to a drain of the second n-channel transistor and its drain connected to a first output node that provides a first output select signal (SELECT0);

a first p-channel transistor having its source connected to a positive supply voltage and its drain connected to the first output node;

a gate of the fourth n-channel transistor and a gate of the first p-channel transistor being connected to receive a complement of a third input address signal (A0);

a fifth n-channel transistor having its source connected to the drain of the second n-channel transistor and its drain connected to a second output node that provides a second output select signal (SELECT1);

a second p-channel transistor having its source connected to the positive supply voltage and its drain connected to the second output node;

a gate of the fifth n-channel transistor and a gate of the second p-channel transistor being connected to receive the third input address signal:

a third p-channel transistor connected between the first and second output nodes and having its gate connected to receive the complement of the second input address signal (A1);

a fourth p-channel transistor connected between the first and second output nodes and having its gate connected to receive the complement of the first input address signal (A2);

a sixth n-channel transistor having its source connected to the drain of the third n-channel transistor and its drain connected to a third output node that provides a third output select signal (SELECT2);

a fifth p-channel transistor having its source connected to the positive supply voltage and its drain connected to the third output node;

a gate of the sixth n-channel transistor and a gate of the fifth p-channel transistor being connected to receive the complement of the third input address signal (A0);

a seventh n-channel transistor having its source connected to the drain of the third n-channel transistor and its drain connected to a fourth output node that provides a fourth output select signal (SELECT3);

a sixth p-channel transistor having its source connected to the positive supply voltage and its drain connected to the fourth output node;

a gate of the seventh n-channel transistor and a gate of the sixth p-channel transistor being connected to receive the third input address signal (A0);

a seventh p-channel transistor connected between the third and fourth output nodes and having its gate connected to receive the second input address signal (A1);

an eighth p-channel transistor connected between the third and fourth output nodes and having its gate connected to receive the complement of the first input address signal (A2);

an eighth n-channel transistor having its source connected to a negative power and its gate connected to receive the first input address signal (A2);

a ninth n-channel transistor having its source connected to a drain of the eighth n-channel transistor and its gate connected to receive the complement of a second input address signal (A1);

a tenth n-channel transistor having its source connected to the drain of the eighth n-channel transistor and its gate connected to receive the second input address signal (A1);

an eleventh n-channel transistor having its source connected to a drain of the ninth n-channel transistor and its drain connected to a fifth output node that provides a fifth output select signal (SELECT4);

a ninth p-channel transistor having its source connected to the positive supply voltage and its drain connected to the fifth output node;

a gate of the eleventh n-channel transistor and a gate of the ninth p-channel transistor being connected to receive the complement of a third input address signal (A0);

a twelfth n-channel transistor having its source connected to the drain of the ninth n-channel transistor and its drain connected to a sixth output node that provides a sixth output select signal (SELECT5);

a tenth p-channel transistor having its source connected to the positive supply voltage and its drain connected to the sixth output node;

a gate of the twelfth n-channel transistor and a gate of the tenth p-channel transistor being connected to receive the third input address signal;

an eleventh p-channel transistor connected between the fifth and sixth output nodes and having its gate connected to receive the complement of the second input address signal (A1);

a twelfth p-channel transistor connected between the fifth and sixth output nodes and having its gate connected to receive the first input address signal (A2);

a thirteenth n-channel transistor having its source connected to the drain of the tenth n-channel transistor and its drain connected to a seventh output node that provides a seventh output select signal (SELECT6);

a thirteenth p-channel transistor having its source connected to the positive supply voltage and its drain connected to the seventh output node;

a gate of the thirteenth n-channel transistor and a gate of the thirteenth p-channel transistor being connected to receive the complement of the third input address signal (A0);

a fourteenth n-channel transistor having its source connected to the drain of the tenth n-channel transistor and its drain connected to an eighth output node that provides an eighth output select signal (SELECT7);

a fourteenth p-channel transistor having its source connected to the positive supply voltage and its drain connected to the eighth output node;

a gate of the fourteenth n-channel transistor and a gate of the fourteenth p-channel transistor being connected to receive the third input address signal (A0);

a fifteenth p-channel transistor connected between the seventh and eighth output nodes and having its gate connected to receive the second input address signal (A1);

a sixteenth p-channel transistor connected between the seventh and eighth output nodes and having its gate connected to receive the first input address signal (A2).

* * * * *

UNITED STATES PATENT AND TRADEMARK OFFICE
CERTIFICATE OF CORRECTION

PATENT NO. : 5,428,306
DATED : June 27, 1995
INVENTOR(S) : Voelkel, et al.

It is certified that error appears in the above-indentified patent and that said Letters Patent is hereby corrected as shown below:

Column 4, line 12, delete "pl", insert --;--;
Column 4, line 34, delete "(IA1)" and insert --(/A1)--;
Column 4, line 58, delete "(IAO)" and insert --(/AO)--;

Column 5, line 41, after voltage insert --;--;
Column 5, line 43, delete "and".

Signed and Sealed this

Second Day of January, 1996

Attest:

BRUCE LEHMAN

Attesting Officer

Commissioner of Patents and Trademarks